United States Patent [19]

West

[11] Patent Number: 5,577,263
[45] Date of Patent: Nov. 19, 1996

[54] CHEMICAL VAPOR DEPOSITION OF FINE GRAINED RHENIUM ON CARBON BASED SUBSTRATES

[75] Inventor: Gary A. West, Budd Lake, N.J.

[73] Assignee: AlliedSignal Inc., Morris Township, N.J.

[21] Appl. No.: 408,234

[22] Filed: Mar. 22, 1995

[51] Int. Cl.⁶ ....................................... B22F 3/00
[52] U.S. Cl. .................. 428/552; 428/544; 428/546; 428/548; 428/549; 428/551; 428/570; 428/634; 427/249; 427/252; 427/255.1; 427/250
[58] Field of Search ............................... 428/544, 546, 428/548, 549, 551, 552, 570, 634; 427/249, 252, 255.1, 250

[56] References Cited

U.S. PATENT DOCUMENTS

| | | | |
|---|---|---|---|
| 3,317,338 | 5/1967 | Batchelor | 117/46 |
| 3,637,374 | 1/1972 | Holzi et al. | 75/174 |
| 4,920,012 | 4/1990 | Woodruff et al. | 428/634 |
| 5,169,685 | 12/1992 | Woodruff et al. | 427/250 |
| 5,209,388 | 5/1993 | Mittendorf et al. | 228/121 |

OTHER PUBLICATIONS

J. G. Donaldson, et al.; "A Preliminary Study of Vapor Deposition Of Rhenium and Rhenium–Tungsten", J. Less Common Metals, vol. 14, pp. 93–101, (1968).

Y. Isobe, et al., "Chemical Vapor Deposition Of Rhenium On Graphite", J. Less Common Metals, vol. 152, pp. 177–184 (1989).

Van Zant, Peter, Microchip Fabrication 2nd Ed., McGraw–Hill, pp. 308–310 Jan. 1990.

*Primary Examiner*—Charles T. Jordan
*Assistant Examiner*—Anthony R. Chi
*Attorney, Agent, or Firm*—Verne E. Kreger, Jr.

[57] ABSTRACT

A method for producing a composite element by causing a stream of gaseous rhenium hexafluoride to flow onto a carbon substrate in a chemical vapor deposition reaction. A flow of hydrogen gas causes a reduction of the rhenium hexafluoride to rhenium metal to thereby deposit a uniform layer of rhenium metal onto the surface of the carbon substrate. A fine grain rhenium coating on carbon is produced having an average particle diameter of from about 0.1 to about 25 micrometers. The elements may be used alone or several of them may be bonded together into various articles. Such elements and articles are useful as light weight, high temperature strength, corrosive gas resistant structural elements.

23 Claims, No Drawings

CHEMICAL VAPOR DEPOSITION OF FINE GRAINED RHENIUM ON CARBON BASED SUBSTRATES

BACKGROUND OF THE INVENTION

1. Field of the Invention

The present invention relates to chemical vapor deposition and more particularly to chemical vapor deposition of fine grained rhenium on carbon based substrates. Such are useful as light weight, high temperature strength, corrosive gas resistant structural elements for manufacturing rocket nozzles, heat exchangers and high temperature valves.

2. Description of the Prior Art

It is known in the art that a composite of carbon fibers in a carbon matrix, i.e. carbon-carbon, is a material with exceptional high temperature strength. Carbon and carbon-carbon structural elements can be used at temperatures where other refractory materials have lost their practical strength. Unfortunately, carbon is susceptible to corrosion, oxidation, and erosion when exposed to oxidizing or corrosive environments, even at moderate temperatures. Carbon is particularly vulnerable to oxidation in hostile environments such as are present in rocket exhaust gases, steam turbines and heat exchangers. The use of carbon-carbon for high temperature applications in such severe environments requires a protective coating. Rhenium is a metal that has been shown to successfully protect materials from erosive and corrosive environments. The protective quality of rhenium depends on its crystalline grain structure. Uniform, fine grained materials produce the best results. Large grain structure in metallic materials introduce stress points resulting in fracture and crack formation during temperature cycling thereby exposing the underlying carbon to corrosion. Uniform, small grains minimize the tendency for crack formation. In addition, the ductility of a protective film determines its ability to survive large temperature variations. A ductile material such as rhenium is able to conform to stresses produced by differences in rhenium and carbon substrate thermal expansions. It is known that films of rhenium can be applied by the method of chemical vapor deposition (CVD). For example, in one commercial practice, rhenium is deposited by the decomposition of gaseous $ReCl_5$, which is formed by exposing rhenium pellets to a stream of chlorine gas at 500° C. to 1200° C. These high deposition temperatures result in rhenium deposits with large grain sizes, on the order of 60 micrometers. Processes that deposit rhenium at high temperature, such as from rhenium pentachloride can result in carbon contamination due to diffusion into the rhenium from the carbon substrate. Carbon impurities in rhenium are known to reduce rhenium ductility, increase film brittleness and reduce the strength of components fabricated from rhenium coated carbon-carbon composites.

It has been reported by Isobe, et al, J. Less-Common Metals, 152, 177 (1989) that a low temperature CVD process can produce fine-grained rhenium films on carbon substrates. However, this process is based on the decomposition of $Re_2(CO)_{10}$ which produces rhenium with a degree of carbon contamination. Rhenium precursors that contain carbon, such as rhenium carbonyl groups, should be avoided since then can directly incorporate carbon into a deposited rhenium film. The use of CVD for the hydrogen reduction of $ReF_6$ to produce rhenium films on copper tubing has been reported by Donaldson, et al, J. Less-Common Metals, 14, 93 (1968).

It has now been unexpectedly found that the reduction of rhenium hexafluoride by hydrogen, which deposits rhenium at low or moderate temperatures is a preferred method of depositing rhenium substantially without carbon contamination. An advantage of relatively low deposition temperature is that the diffusion of carbon from the substrate into the rhenium is minimized during rhenium deposition. Rhenium on carbon structural elements produced by the method of this invention find use in applications requiring grain sizes of very small dimensions. These include diffusion bonding of adjacent rhenium sheets where small grain sizes enhance the metal diffusion rates, and braze bonding of rhenium sheets where the indiffusion of the braze metal is enhanced by rapid grain growth of deposited fine metal grains. The fine grained rhenium structure results in uniform bond formation that maintains its strength at high temperatures.

SUMMARY OF THE INVENTION

The invention provides a method for producing a composite element which comprises causing a stream of gaseous rhenium hexafluoride to flow onto a carbon substrate in the presence of a stream of sufficient hydrogen gas to cause a reduction of the rhenium hexafluoride to rhenium metal, for a time and under conditions sufficient to deposit a substantially uniform layer of rhenium metal onto the surface of the substrate.

The invention also provides an element which comprises a carbon substrate and a substantially uniform layer of vapor deposited rhenium on the surface of the substrate, wherein the rhenium has an average grain diameter of from about 0.1 to about 25 micrometers.

The invention further provides an article which comprises a plurality of elements bonded together, said elements comprising a carbon substrate and a substantially uniform layer of vapor deposited rhenium on the surface of the substrate.

DETAILED DESCRIPTION OF THE PREFERRED EMBODIMENT

In the practice of the present invention, a composite element of a carbon or carbon-carbon matrix substrate is provided with a surface coating of fine grained rhenium. Suitable carbon substrates are commercially available as DFP-3 and AXF-5Q from POCO Graphite, Inc. of Decatur, Tex. A carbon-carbon matrix comprising carbon fibers with deposited carbon and formed into a monolith is available as Carbenix-4000 from AlliedSignal Inc. of Morristown, N.J.

Rhenium metal is coated onto the carbon substrate by a chemical vapor deposition from rhenium hexafluoride. Chemical vapor deposition reactors are well known in the art. A suitable reactor is a hot wall CVD reactor which comprises a 4 inch diameter quartz tube surrounded by an external furnace. One suitable reactor is model SK-23-6-93 commercially available from Vactronic Equipment Labs of Bohemia, N.Y. In the process, a carbon substrate is placed in the chemical vapor deposition reactor. The reactor is sealed and evacuated to less than one millitorr of ambient background gas pressure. In the preferred embodiment, a flow of an inert gas, such as argon is established and the chamber is heated until it is stabilized to the desired reaction temperature and gas flow rate. The argon is preferred since it has been found to increase the ductility of the rhenium film by reduction of fluorine containing grain boundary impurities. The argon gas flow ranges from 0 to about 5,000 sccm (standard cubic centimeters per minute measured at 0° C.

and atmospheric pressure) or preferably from about 500 to about 2,000 sccm and most preferably about 1,000 sccm. The substrate temperature ranges from about 200° C. to about 1,150° C., or more preferably from about 450° C. to about 1,050° C. and most preferably about 950° C. The reactor gas pressure preferably ranges from about 0.1 to about 760 torr, more preferably from about 0.2 to about 400 torr and most preferably from about 0.25 to about 2.0 torr. After the temperature has stabilized, a hydrogen flow is introduced while maintaining a constant pressure. Sufficient hydrogen gas must be delivered to reduce rhenium hexafluoride to rhenium metal. This requires at least 3 moles of hydrogen gas per mole of rhenium hexafluoride. Preferably hydrogen is introduced in a large excess such as 10 or 20 moles of hydrogen per mole of rhenium hexafluoride.

The hydrogen gas flow ranges from about 10 to about 1000 sccm or preferably from about 50 to about 500 sccm and most preferably about 500 sccm. After the hydrogen flow has stabilized, a rhenium hexafluoride flow is introduced while still maintaining a constant pressure to initiate the rhenium deposition. The rhenium hexafluoride gas flow ranges from about 1 to about 100 sccm or preferably from about 5 to about 20 sccm and most preferably about 10 sccm. The gas flow, temperature and pressure are maintained for from about 0.5 hour to about 48 hours, preferably from about 2 hours to about 8 hours to continue the rhenium deposition. After the desired time, rhenium hexafluoride and hydrogen flow are stopped and the sample is returned to room temperature while maintaining the argon flow to maintain a constant pressure. After the sample has reached room temperature, the rhenium coated carbon substrate is removed from the reaction chamber. Preferably the deposited rhenium has a thickness of from about 0.1 micrometer to about 5 mm on the substrate, preferably from about 0.5 to about 100 micrometers and most preferably about 50 micrometers. The forgoing flow conditions are suitable for a 4 inch diameter reactor. Flow conditions depend on the reactor diameter and a larger reactor will require greater flows. Average grain diameters of from about 0.1 to about 25 micrometers are obtained by the present invention. More preferably, the grain diameters range from about 1 to about 10 micrometers. The rhenium grain size is controlled by varying the deposition temperature. For example, a 1 micrometer diameter can be obtained at about 400° C. and a grain diameter of about 10 micrometers can be obtained at about 850° C.

The elements formed according to this invention are particularly useful for forming the bonded carbonaceous bodies which are described in U.S. Pat. No. 5,209,388, which is incorporated herein by reference. In addition, the elements are useful for forming structural articles which comprises a plurality of the elements bonded together. In general, one or more elements comprising a carbon substrate and a substantially uniform layer of vapor deposited rhenium on the surface of the substrate are pressed together at high temperatures for a sufficient time for bonding to occur. In the preferred embodiment, a plurality of rhenium coated carbon substrates are compressed together at pressures of from about 700 to about 2,500 psi, or more preferably from about 1,000 to about 1,600 psi. The elements are heated to temperatures of from about 1,400° C. to about 2,600° C., preferably from about 1,600° C. to about 1,800° C. for from about 15 minutes to about 1 hour, or more preferably for from about 30 minutes to about 45 minutes.

The following non-limiting examples serve to illustrate the invention.

EXAMPLE 1

A rectangular carbon substrate is mounted in a hot wall chemical vapor deposition reactor along the center line of a reactor tube and located in the center of a furnace hot zone. The reactor is sealed and evacuated to less than one millitorr of ambient background gas pressure. An argon flow of 1000 sccm is established at a pressure of 1.0 torr. The furnace temperature is set to 850° C. The argon flow and pressure are maintained while the furnace and substrate are heated to 850° C. After the temperature has stabilized, a hydrogen flow of 500 sccm is introduced while maintaining the pressure at 1.0 torr. After the hydrogen flow has stabilized, a rhenium hexafluoride flow of 20 sccm is introduced while still maintaining a pressure of 1.0 torr to initiate the rhenium deposition. The gas flow, temperature and pressure are maintained for three hours to continue the rhenium deposition. After three hours, the rhenium hexafluoride and hydrogen flow are stopped and the sample is returned to room temperature while maintaining the argon flow at 1000 sccm at a pressure of 1.0 torr. After the sample has reached room temperature, the carbon substrate is removed. Measurement of the weight increase of the rhenium coated carbon substrate indicates a deposited rhenium thickness of 50 micrometers.

EXAMPLE 2

A rectangular carbon substrate is mounted in a hot wall chemical vapor deposition reactor along the center line of a reactor tube and located in the center of a furnace hot zone. The reactor is sealed and evacuated to less than one millitorr of ambient background gas pressure. An argon flow of 1000 sccm is established at a pressure of 0.5 torr. The furnace temperature is set to 950° C. The argon flow and pressure are maintained while the furnace and substrate are heated to 950° C. After the temperature has stabilized, a hydrogen flow of 500 sccm is introduced while maintaining the pressure at 0.5 torr. After the hydrogen flow has stabilized, a rhenium hexafluoride flow of 10 sccm is introduced while still maintaining a pressure of 0.5 torr to initiate the rhenium deposition. The gas flow, temperature and pressure are maintained for four hours to continue the rhenium deposition. After four hours, the rhenium hexafluoride is stopped and the sample is returned to room temperature while maintaining the argon flow at 1000 sccm at a pressure of 0.5 torr. After the sample has reached room temperature, the carbon substrate is removed. Measurement of the weight increase of the rhenium coated carbon substrate indicates a deposited rhenium thickness of 25 micrometers.

EXAMPLE 3

A rectangular carbon substrate is mounted in a hot wall chemical vapor deposition reactor along the center line of a reactor tube and located in the center of a furnace hot zone. The reactor is sealed and evacuated to less than one millitorr of ambient background gas pressure. An argon flow of 1000 sccm is established at a pressure of 0.5 torr. The furnace temperature is set to 950° C. The argon flow and pressure are maintained while the furnace and substrate are heated to 950° C. The furnace is translated past the substrate at a rate of 8"/hour. After the temperature has stabilized, a hydrogen flow of 500 sccm is introduced while maintaining the pressure at 0.5 torr. After the hydrogen flow has stabilized, a rhenium hexafluoride flow of 10 sccm is introduced while still maintaining a pressure of 0.5 torr to initiate the rhenium deposition. The gas flow, temperature and pressure are maintained for two hours to continue the rhenium deposition. After two hours, the rhenium hexafluoride and hydrogen flow are stopped and the sample is returned to room temperature while maintaining the argon flow at 1000 sccm at a pressure of 0.5 torr. After the sample has reached room temperature, the carbon substrate is removed. Measurement of the weight increase of the rhenium coated carbon substrate indicates a deposited rhenium thickness of 10 micrometers. This example shows rhenium deposition using a translating furnace.

EXAMPLE 4

A rectangular carbon substrate is mounted in a hot wall chemical vapor deposition reactor along the center line of a reactor tube and located in the center of a furnace hot zone. The reactor is sealed and evacuated to less than one millitorr of ambient background gas pressure. An argon flow of 1000 sccm is established at a pressure of 0.25 torr. The furnace temperature is set to 950° C. The argon flow and pressure are maintained while the furnace and substrate are heated to 950° C. After the temperature has stabilized, a hydrogen flow of 500 sccm is introduced while maintaining the pressure at 0.25 torr. After the hydrogen flow has stabilized, a rhenium hexafluoride flow of 10 sccm is introduced while still maintaining a pressure of 0.25 torr to initiate the rhenium deposition. The gas flow, temperature and pressure are maintained for nineteen hours to continue the rhenium deposition. After nineteen hours, the rhenium hexafluoride and hydrogen flow are stopped and the sample is returned to room temperature while maintaining the argon flow at 1000 sccm at a pressure of 0.25 torr. After the sample has reached room temperature, the carbon substrate is removed. Measurement of the weight increase of the rhenium coated carbon substrate indicates a deposited rhenium thickness of 30 micrometers.

EXAMPLE 5

A rectangular carbon substrate is mounted in a hot wall chemical vapor deposition reactor along the center line of a reactor tube and located in the center of a furnace hot zone. The reactor is sealed and evacuated to less than one millitorr of ambient background gas pressure. A hydrogen flow of 500 sccm is established at a pressure of 0.5 torr. The hydrogen flow and pressure are maintained while the furnace and substrate are heated to 850° C. After the hydrogen flow has stabilized, a rhenium hexafluoride flow of 20 sccm is introduced while maintaining a pressure of 0.5 torr to initiate the rhenium deposition. The gas flow, temperature and pressure are maintained for 3.1 hours to continue the rhenium deposition. After 3.1 hours, the rhenium hexafluoride and hydrogen flow are stopped and the sample is returned to room temperature. After the sample has reached room temperature, the carbon substrate is removed. Measurement of the weight increase of the rhenium coated carbon substrate indicates a deposited rhenium thickness of 20 micrometers.

This example shows rhenium deposition without argon flow.

EXAMPLE 6

A rectangular carbon substrate is mounted in a hot wall chemical vapor deposition reactor along the center line of a reactor tube and located in the center of a furnace hot zone. The reactor is sealed and evacuated to less than one millitorr of ambient background gas pressure. A hydrogen flow of 500 sccm is established at a pressure of 0.5 torr. The hydrogen flow and pressure are maintained while the furnace and substrate are heated to 850° C. The furnace is translated past the substrate at a rate of 2"/hour. After the hydrogen flow has stabilized, a rhenium hexafluoride flow of 20 sccm is introduced while maintaining a pressure of 0.5 torr to initiate the rhenium deposition. The gas flow, temperature and pressure are maintained for 13 hours to continue the rhenium deposition. After 13 hours, the rhenium hexafluoride and hydrogen flow are stopped and the sample is returned to room temperature. After the sample has reached room temperature, the carbon substrate is removed. Measurement of the weight increase of the rhenium coated carbon substrate indicates a deposited rhenium thickness of 60 micrometers. This example shows rhenium deposition without argon flow but with furnace translation.

EXAMPLE 7 (COMPARATIVE)

A rectangular carbon substrate is mounted in a hot wall chemical vapor deposition reactor along the center line of a reactor tube and located in the center of a furnace hot zone. The reactor is sealed and evacuated to less than one millitorr of ambient background gas pressure. An argon flow of 500 sccm is established at a pressure of 0.5 torr. The furnace temperature is set to 1,050° C. The argon flow and pressure are maintained while the furnace and substrate are heated to 1,050° C. After the temperature and argon flow have stabilized, a rhenium hexafluoride flow of 10 sccm is introduced while still maintaining a pressure of 0.5 torr to initiate the rhenium deposition. The gas flow, temperature and pressure are maintained for two hours to continue the rhenium deposition. After two hours, the rhenium hexafluoride flow is stopped and the sample is returned to room temperature while maintaining the argon flow at 500 sccm at a pressure of 0.5 torr. After the sample has reached room temperature, the carbon substrate is removed. Measurement of the weight increase of the carbon substrate indicates no detectable rhenium deposit. This example indicates that no rhenium is deposited without hydrogen flow.

What is claimed is:

1. A method for producing a composite element which comprises causing a stream of gaseous rhenium hexafluoride to flow onto a plurality of carbon substrates in the presence of a stream of sufficient hydrogen gas to cause a reduction of the rhenium hexafluoride to rhenium metal, for a time and under conditions sufficient to deposit a substantially uniform layer of rhenium metal onto the surface of the substrates and then bonding together a plurality of the thusly produced rhenium coated substrates.

2. The method of claim 1 wherein said conditions comprise conducting a stream of an inert gas to the substrates.

3. The method of claim 2 wherein the inert gas comprises argon.

4. The method of claim 3 wherein the argon gas flows at a rate of up to about 5,000 sccm.

5. The method of claim 1 wherein the gaseous rhenium hexafluoride flows at a rate of from 1 to about 100 sccm.

6. The method of claim 1 wherein the hydrogen gas flows at a rate of from about 10 to about 1000 sccm.

7. The method of claim 1 wherein at least 3 moles of hydrogen is reacted per mole of rhenium hexafluoride.

8. The method of claim 1 which is conducted at a temperature of from about 200° C. to about 1,150° C.

9. The method of claim 1 which is conducted at a pressure of from about 0.1 to about 760 torr.

10. The method of claim 1 which is conducted for from about 0.5 hour to about 48 hours.

11. The method of claim 1 wherein the deposited rhenium has a thickness of from about 0.1 micrometer to about 5 mm on the substrates.

12. The method of claim 1 wherein the rhenium metal has an average grain diameter of from about 0.1 to about 25 micrometers.

13. The method of claim 1 wherein each substrate comprises a monolithic matrix comprising carbon deposited on carbon fibers.

14. The method of claim 1 wherein said conditions comprise conducting a stream of argon gas to the substrates at a rate of up to about 5,000 sccm; wherein the gaseous rhenium hexafluoride flow rate ranges from 1 to about 100 sccm; wherein at least 3 moles of hydrogen gas is reacted per mole of rhenium hexafluoride; wherein the hydrogen gas flow rate ranges from about 10 to about 1000 sccm; wherein the reaction is conducted at a temperature of from about 200° C. to about 1,150° C. and at a pressure of from about 0.1 to about 760 torr for from about 0.5 hour to about 48 hours; wherein the deposited rhenium has a thickness of from about 0.1 micrometer to about 5 mm on the substrates and wherein the rhenium metal has an average grain diameter of from about 0.1 to about 25 micrometers.

15. An element produced according to the method of claim 1.

16. An element produced according to the method of claim 14.

17. An element which comprises a carbon substrate in the form of a rocket nozzle, a valve, a stream turbine segment or a heat exchanger segment, and a substantially uniform layer of vapor deposited rhenium on the surface of the substrate, wherein the rhenium has an average grain diameter of from about 0.1 to about 25 micrometers.

18. The element of claim 17 wherein the substrate comprises a monolithic matrix comprising carbon deposited on carbon fibers.

19. The element of claim 17 wherein the rhenium layer has a thickness of from about 1 micrometer to about 5 mm.

20. An article which comprises a plurality of elements bonded together, said elements comprising a carbon substrate and a substantially uniform layer of vapor deposited rhenium on the surface of the substrate.

21. The article of claim 20 wherein the rhenium has an average grain diameter of from about 0.1 to about 25 micrometers.

22. The article of claim 21 wherein the substrate comprises a monolithic matrix comprising carbon deposited on carbon fibers.

23. The article of claim 20 wherein the rhenium layer has a thickness of from about 1 micrometer to about 5 mm.

* * * * *